(12) United States Patent
Arnold et al.

(10) Patent No.: US 12,138,606 B2
(45) Date of Patent: Nov. 12, 2024

(54) 3-D MIXING AND PARTICLE DELIVERY VIA MOVABLE ELECTROMAGNETS ASSEMBLIES

(71) Applicant: DH Technologies Development Pte. Ltd., Singapore (SG)

(72) Inventors: Don W Arnold, Livermore, CA (US); Thomas R. Covey, Richmond Hill (CA); Chang Liu, Richmond Hill (CA)

(73) Assignee: DH Technologies Development Pte. Ltd., Singapore (SG)

( * ) Notice: Subject to any disclaimer, the term of this patent is extended or adjusted under 35 U.S.C. 154(b) by 222 days.

(21) Appl. No.: 16/765,854

(22) PCT Filed: Nov. 20, 2018

(86) PCT No.: PCT/IB2018/059146
§ 371 (c)(1),
(2) Date: May 20, 2020

(87) PCT Pub. No.: WO2019/102355
PCT Pub. Date: May 31, 2019

(65) Prior Publication Data
US 2020/0360879 A1 Nov. 19, 2020

Related U.S. Application Data

(60) Provisional application No. 62/589,098, filed on Nov. 21, 2017.

(51) Int. Cl.
*B01F 33/451* (2022.01)
*B01F 23/50* (2022.01)
(Continued)

(52) U.S. Cl.
CPC ............ *B01F 33/451* (2022.01); *B01F 23/59* (2022.01); *B01F 35/221* (2022.01); *B03C 1/01* (2013.01);
(Continued)

(58) Field of Classification Search
CPC .... B01F 33/451; B01F 33/053; B03C 1/0335; B03C 1/288; B03C 2201/18; B03C 1/286; B03C 1/033
(Continued)

(56) References Cited

U.S. PATENT DOCUMENTS 6,879,067 B1   4/2005   Rockwell
8,084,271 B2*   12/2011   Korpela ........... G01N 33/54326
                                                                    422/68.1
(Continued)

FOREIGN PATENT DOCUMENTS

DE    202014004711 U1   6/2015
EP    1974821 A1 *   10/2008   ........... B03C 1/0335
WO   2017093896 A1   6/2017

OTHER PUBLICATIONS

1 International Search Report and Written Opinion for PCT/IB2018/059146 mailed Feb. 21, 2019.

*Primary Examiner* — Michael McCullough
*Assistant Examiner* — Molly K Devine
(74) *Attorney, Agent, or Firm* — Potomac Law Group, PLLC; Reza Mollaaghababa; Ido Rabinovitch (57) ABSTRACT

A fluid processing system that can include a sample container having a sample chamber for containing a fluid and a plurality of magnetic particles and at least one movable magnetic assembly configured to be movably inserted into or out of the sample chamber. The movable magnetic assembly can include a plurality of electromagnets that generate a magnetic field within at least a portion of the
(Continued)

sample chamber when the assembly is inserted at least partially into the sample chamber. The fluid processing system can also include a signal generator that applies electrical signals, e.g., AC electrical signals, to the electromagnets of the magnetic assembly and a controller coupled to the signal generator that is configured to control phases of the electrical signals applied to the electromagnets to generate magnetic field gradients within the portion of the sample chamber effective to magnetically influence the plurality of the magnetic particles.

18 Claims, 9 Drawing Sheets

(51) Int. Cl.
*B01F 35/221* (2022.01)
*B03C 1/01* (2006.01)
*B03C 1/033* (2006.01)
*B03C 1/28* (2006.01)
*B03C 1/30* (2006.01)
*G01R 33/12* (2006.01)
*B01F 101/23* (2022.01)

(52) U.S. Cl.
CPC ............ *B03C 1/0335* (2013.01); *B03C 1/288* (2013.01); *B03C 1/30* (2013.01); *B01F 2101/23* (2022.01); *B03C 2201/18* (2013.01)

(58) Field of Classification Search
USPC ........................................................ 366/273
See application file for complete search history.

(56) References Cited

U.S. PATENT DOCUMENTS

| | | | |
|---|---|---|---|
| 8,361,316 B2 * | 1/2013 | Siddiqi | ..................... B03C 1/01 |
| | | | 209/225 |
| 2006/0209628 A1 * | 9/2006 | Jones | ..................... B01F 35/94 |
| | | | 366/273 |
| 2013/0217144 A1 | 8/2013 | Rida | |

* cited by examiner

FIG. 8C

3-D MIXING AND PARTICLE DELIVERY VIA MOVABLE ELECTROMAGNETS ASSEMBLIES

RELATED APPLICATION

This application claims the benefit of priority from U.S. Provisional Application No. 62/589,098 filed 21 Nov. 2017, the entire contents of which are incorporated by reference herein.

FIELD

The present teachings generally relate to processing fluids, and more particularly, to methods and systems for processing fluids using electromagnetic structures configured to manipulate magnetic particles disposed within the fluids.

INTRODUCTION

The preparation of samples is a critical phase of chemical and biological analytical studies. In order to achieve precise and reliable analyses, target compounds must be processed from complex, raw samples and delivered to analytical equipment. For example, proteomic studies generally focus on a single protein or a group of proteins. Accordingly, biological samples are processed to isolate a target protein from the other cellular materials in the sample. Additional processing is often required, such as protein isolation (e.g., immunoprecipitation), matrix cleanup, digestion, desalting. Non-target substances such as salts, buffers, detergents, proteins, enzymes, and other compounds are typically found in chemical and biological samples. These non-target substances can interfere with an analysis, for example, by causing a reduction in the amount of target signal detected by analytical equipment. As such, complex, raw samples are typically subjected to one or more separation and/or extraction techniques to isolate compounds of interest from non-target substances.

Liquid chromatography (LC) is a typical solution-based technique for the separation of an analyte of interest present in a complex mixture of different substances. LC generally involves running a liquid sample over a solid, insoluble matrix. The liquid sample may include an analyte of interest having an affinity for the matrix under certain conditions, for example, pH, salt concentration, or solvent composition conditions. During LC, the chemical components in a mixture may be carried through a stationary phase by the flow of a liquid mobile phase. Separation in liquid chromatography occurs due to differences in the interactions of the analytes with both the mobile and stationary phases. High performance liquid chromatography (HPLC) is a form of LC in which an analyte is forced through the stationary phase in a liquid mobile phase at high pressure. Forcing the analyte using high pressure decreases the time the separated components remain on the stationary phase and, therefore, the time the components have to diffuse within the column. HPLC typically results in processed samples that may be used by analytical equipment to achieve better resolution and sensitivity compared with conventional LC techniques. However, LC is a complex technique that is costly to use for processing samples and is a serial process such that multiple, parallel columns are required to process a plurality of samples simultaneously. In addition, LC may irreversibly adsorb and/or co-elute certain potential target materials. Although HPLC is faster than LC (typically requiring about 10-30 minutes to process a sample), the complexity and cost of HPLC is much greater than conventional LC, for example, due to pumps and other specialized equipment required to carry out the process.

Magnetic particles or beads are another technology that may be employed for sample preparation for chemical and biological assays and diagnostics. Illustrative magnetic particles have been described in U.S. Pat. Nos. 4,582,622 and 4,628,037. Examples of devices and methods employing magnetic particles for sample separation and extraction are described in U.S. Pat. Nos. 4,554,088 and 8,361,316. Such magnetic particles have also been used in microfluidic systems, such as those disclosed in an article entitled "Magnetic bead handling on-chip: new opportunities for analytical applications," authored by Martin A. M. Gijs and published in Microfluid Nanofluid (2004; I: 22-40).

Magnetic particle technology is a robust technology that provides for high performance (e.g., device sensitivity and accuracy) and also provides for easy automation of assay protocols. For many applications, the surface of magnetic particles is coated with a suitable ligand or receptor, such as antibodies, lectins, oligonucleotides, or other bioreactive molecules, which can selectively bind a target substance in a mixture with other substances. One key element in magnetic particle separation and handling technology is efficient mixing to enhance the reaction rate between the target substances and the particle surfaces. Suspended magnetic particles may be actuated by magnetic forces, resulting in agitation of a sample solution to enhance or generate mixing processes. Examples of magnetic particle mixing systems have been disclosed in an article entitled "A chaotic mixer for magnetic bead-based micro cell sorter," authored by Suzuki et al. and published in the Journal of Microelectromechanical Systems (2004; I: 13:779-790) and an article entitled "A rapid magnetic particle driven micromixer," authored by Wang et al. and published in Microfluid Nanofluid (2008; I: 4:375-389).

Previous techniques for mixing fluids using magnetic particles, such as disclosed in U.S. Pat. Nos. 6,231,760, 6,884,357, and 8,361,316, have involved moving a magnet relative to a stationary container or moving the container relative to a stationary magnet using mechanical means to induce relative displacement of a magnetic field gradient within the container. The displacement of magnetic field gradients using such methods may cause some mixing within the container by inducing the magnetic particles to move continuously with the change of the magnet position. However, the formation of the magnetic field gradient within the container may attract and confine the particles in regions close to the walls of the container, which reduces mixing efficiency and effectiveness. Another technique described in International Patent Application Publication No. WO 1991/09308 involves the use of two electromagnets facing each other around a chamber having magnetic particles arranged therein. Sequentially energizing and de-energizing the two electromagnets (i.e., binary on/off control) at a sufficient frequency operates to suspend the magnetic particles within a fluid disposed in the chamber. The movement of particles resulting from actuating the two electromagnets according to this method is limited to a small area within the chamber and generates relatively weak mixing forces. In addition, a portion of the magnetic particles may not be effected by the magnetic fields. The non-effected particles aggregate near chamber surfaces and do not contribute to mixing or affinity binding.

U.S. Pat. No. 8,585,279 discloses a microfluidic chip device (the "MagPhase" device of Spinomix SA) that employs radio frequency (RF) driven electromagnets in combination with integrated pumps and fluidic channels to actuate magnetic particles within an enclosed sample container. The electromagnets are actuated in a sequence configured to vary a magnetic field gradient within the sample container to effectuate the movement of the magnetic particles within a sample fluid. However, the mixing of samples using the MagPhase device is inherently serial in nature as the configuration of the microfluidic device only allows for the processing of a limited number of samples simultaneously. Due to the particular configuration, the MagPhase device experiences relatively large sample volume loss and magnetic particle loss. Furthermore, the enclosed channels and sample container of the MagPhase microfluidic device introduces a barrier to automation of the loading and collection of sample volumes from the device and limits the sample volumes capable of being processed. Samples processed using the MagPhase device are necessarily exposed to a large contact surface area as they are required to travel through the various channels and fluidic paths of the device. Accordingly, samples processed via the MagPhase device are susceptible to high carry-over and low recoveries, for example, due to non-specific binding.

Magnetic particles have also been used in sample plate applications, such as the SISCAPA technique described in an article entitled "Mass spectrometric quantitation of peptides and proteins using Stable Isotope Standards and Capture by Anti-Peptide Antibodies (SISCAPA)," authored by Anderson et al. and published in the Journal of Proteome Research (2004; I: 3:235-244). Exemplary magnetic sample plate systems include the Agencourt SPRIPlate 96R—Ring Super Magnet Plate provided by Beckman Coulter, Inc. of Brea, California, United States and the Magnum FLX provided by Alpaqua® of Beverly, Massachusetts, United States. In these applications, the sample plates include a plurality of fixed-field magnets arranged such that the magnets either protrude between the sample wells or allow the sample wells to be positioned within ring-shaped magnets. Magnetic particles within the sample wells may be agitated to promote mixing and the magnetic particles can then be trapped through the influence of the permanent magnets. Other types of automated mixing devices generally attempt to achieve mixing by mechanical agitation (i.e., by shaking the sample plate). After processing the samples, the magnets may be used to confine the beads to the side of the sample wells to allow for the removal of the sample fluid. However, the fixed-field magnets used in conventional magnetic sample plate applications are not capable of achieving robust mixing. For example, the magnetic particles generally tend to aggregate and cluster in discrete areas of the sample wells. In addition, the plate itself must be moved between steps of the analysis, which requires significant automation.

Conventional sample mixing systems using magnetic particles, including those mentioned above, suffer from a number of shortcomings. For example, such systems can be limited to mixing samples in a single dimension, mainly in an x-y plane. Thus, such sample mixing systems are restricted to handling relatively shallow and low-volume sample containers. Accordingly, a need exists to improve the overall speed and efficiency of sample mixing and separation using magnetic particles, including ultra-fast homogenous mixing of sample fluids and the accessible, parallel processing of a large number of sample fluids having larger sample volumes.

SUMMARY

In one aspect, a fluid processing system is disclosed, which comprises a sample container including at least one sample chamber for containing a fluid and a plurality of magnetic particles, at least one movable electromagnetic assembly (herein also referred to as MEMA) configured to be movably inserted into or out of said sample chamber, said movable electromagnetic assembly comprising a plurality of electromagnets arranged to generate a magnetic field within at least a portion of the sample chamber when the assembly is inserted at least partially into said sample chamber. The fluid processing system can also include at least one signal generator for applying electrical signals to said electromagnets of the electromagnetic assembly, and a controller coupled to said signal generator for controlling phases of the electrical signals applied to said electromagnets so as to generate magnetic field gradients within said at least a portion of the sample chamber effective to magnetically influence the plurality of the magnetic particles. In some embodiments, the signal generator is configured to generate AC (alternating current) signals for application to the electromagnets. By way of example, the AC signals can have a frequency in a range of about less than about 1 Hz (e.g., 0.5 Hz) to about 5000 Hz. In such embodiments, the AC signals can be voltage signals with an amplitude, for example, in a range of about 1 volt to about 500 volts.

In some embodiments, the electromagnets of the movable electromagnetic assembly can be arranged so as to cause mixing of the magnetic particles substantially within a plane, e.g., x-y plane.

In some embodiments, the plurality of electromagnets of the movable electromagnetic assembly can include a first, a second, a third and a fourth electromagnet and the controller is configured to effect the application of a plurality of electrical signals to said electromagnets in accordance with the following relations:

$$I_{first} = I_0 \sin(ft)$$

$$I_{second} = I_0 \sin\left(ft + \frac{\pi}{2}\right)$$

$$I_{third} = I_0 \sin(ft + \pi)$$

$$I_{fourth} = I_0 \sin\left(ft + \frac{3\pi}{2}\right)$$

where, $I_{first}$, $I_{first}$, $I_{first}$, and $I_{first}$ represent, respectively, waveforms applied to the first, second, third and fourth electromagnets, $I_0$ represent signal amplitude and f denotes signal frequency.

In some embodiments, the movable electromagnetic assembly comprises a shell in which the plurality of electromagnets are incorporated. The shell can be shaped and sized for at least partial insertion into the sample chamber.

In some embodiments, the fluid processing system includes at least one magnetic structure comprising a plurality of electromagnets disposed around the sample chamber, said electromagnets of said at least one magnetic structure being electrically coupled to said signal generator. In such embodiments, the controller can be configured to cause application of electrical signals having different phases to the electromagnets of the magnetic structure so as to generate magnetic field gradients within at least a portion of said sample chamber effective to magnetically influence the magnetic particles.

In some embodiments, the electromagnets of the magnetic structure are vertically spaced from the electromagnets of said movable magnetic assembly and said controller effect application of a pattern of electrical signals to said electromagnets of the magnetic structure and the electromagnets of said movable magnetic assembly so as to generate magnetic field gradients along said vertical direction.

In some embodiments of the fluid processing system, each of the movable magnetic assembly and the magnetic structure surrounding at least one sample well includes four electromagnets, herein referred to as a first, a second, a third and a fourth electromagnet. In some such embodiments, the controller is configured to effect the application of a plurality of electrical signals to said electromagnets in accordance with the following relations:

$$I_{first,MEMA} = I_0 \sin(ft)$$

$$I_{second,MEMA} = I_0 \sin\left(ft + \frac{\pi}{2}\right)$$

$$I_{third,MEMA} = I_0 \sin(ft + \pi)$$

$$I_{fourth,MEMA} = I_0 \sin\left(ft + \frac{3\pi}{2}\right)$$

$$I_{first,MS} = I_0 \sin\left(ft + \frac{\pi}{2}\right)$$

$$I_{second,MS} = I_0 \sin(ft + \pi)$$

$$I_{third,MS} = I_0 \sin\left(ft + \frac{3\pi}{2}\right)$$

$$I_{fourth,MS} = I_0 \sin(ft)$$

where, $I_{first,MEMA}$, $I_{second,MEMA}$, $I_{third,MEME}$, and $I_{fourth,MEMA}$ represent, respectively, waveforms applied to the first, second, third and fourth electromagnets of the magnetic field assembly, and $I_{first,MS}$, $I_{first,MS}$, $I_{first,MS}$, $I_{first,MS}$ represent, respectively, to signal waveforms applied to the first, second, third and fourth electromagnets of the magnetic structure surrounding the sample chamber, $I_0$ represents signal amplitude and f denotes signal frequency, and where, $I_{first,MEMA}$ and $I_{first,MS}$ are vertically adjacent,
$I_{second,MEMA}$ and $I_{second,MS}$ are vertically adjacent,
$I_{third,MEMA}$ and $I_{third,MS}$ are vertically adjacent,
$I_{fourth,MEMA}$ and $I_{fourth,MS}$ are vertically adjacent.

In some embodiments, the fluid processing system further includes a DC signal generator operating under control of the controller for applying one or more DC signals to one or more of the electromagnets of the movable electromagnetic assembly for trapping the magnetic particles therein.

In some embodiments, the controller includes at least one memory module configured to store at least one sample processing protocol for execution by the controller.

In some embodiments, the fluid processing system can include a sample container providing a plurality of fluidically-isolated sample chambers. In some such embodiments, each sample chamber can include a magnetic structure comprising a plurality of electromagnets disposed around the sample chamber, where at least two of the magnetic structures share one or more electromagnets.

In some embodiments, the sample container includes one or more sample chambers having a volume in a range of about one microliter to about one liter.

In a related aspect, a fluid processing system is disclosed, which includes a sample container including at least one sample chamber for containing a fluid and a plurality of magnetic particles, at least one movable electromagnetic assembly comprising one electromagnet and configured to be movably inserted into or out of said sample chamber, a magnetic structure comprising a plurality of electromagnets disposed around said sample chamber, at least one signal generator for applying electrical signals to said electromagnet of said movable magnetic assembly and said electromagnets of the magnetic structure, and a controller coupled to said signal generator for controlling phases of the electrical signals applied to said electromagnets so as to generate magnetic field gradients within at least a portion of the sample chamber effective to magnetically influence the plurality of the magnetic particles. In some such embodiments, the controller is configured to effect application of a signal to said electromagnet of the movable magnetic assembly having a phase different than phases of the signals applied to said electromagnets of the magnetic structure.

In a related aspect, a method for processing fluids is disclosed, which includes delivering a fluid sample and a plurality of magnetic particles to a fluid chamber having a magnetic structure comprising a plurality of electromagnets disposed around said fluid chamber, inserting a movable electromagnetic assembly at least partially into said fluid chamber, said movable electromagnetic assembly comprising at least one electromagnet, and applying RF electrical signals to said electromagnets of said magnetic structure and said at least one electromagnet of the movable electromagnetic assembly so as to generate magnetic field within at least a portion of said fluid chamber effective to magnetically influence the magnetic particles, thereby causing mixing of the fluid.

In some embodiments, the method can further include the step of, subsequent to mixing of the fluid, terminating the application of the electrical signals to the electromagnets, and applying at least one DC signal to at least one of the electromagnets, and in many embodiments to all of the electromagnets, of the movable electromagnetic assembly for trapping at least a portion of the magnetic particles in the movable electromagnetic assembly. The trapped magnetic particles can be delivered to another device and/or container, e.g., another sample vial.

In some embodiments, the trapped particles can be moved to another sample vial by turning off the DC signal (e.g., DC voltage) applied to at least one of the electromagnets of the electromagnetic assembly so as to release the particles into a receiving sample chamber, e.g., a sample vial. In some embodiments, the receiving sample chamber, e.g., a sample vial, can include one or more electromagnets that surround that chamber, e.g., in a manner discussed below. In some such embodiments, the application of one or more AC and/or DC signals to one or more of the electromagnets surrounding the chamber can facilitate the transfer of the particles from the electromagnetic movable assembly into the sample chamber.

DETAILED DESCRIPTION

The present invention generally relates to systems and methods for mixing fluids in which magnetic field gradients are employed to agitate magnetic particles dispersed in a fluid, thereby mixing the fluid. More specifically, in many embodiments, the combination of one or more movable electromagnetic assemblies configured for insertion into one or more of sample wells containing the fluid and the dispersed magnetic particles and magnetic structures associated with those samples wells are employed to cause three-dimensional (3D) mixing of the fluid. For example, the application of RF signals to the movable electromagnetic assemblies and/or the magnetic structures associated with the sample wells can generate magnetic fields gradients that cause the magnetic particle to move, spin, vibrate, or otherwise be agitated, thereby mixing the fluid. Various terms are used herein according to their ordinary meanings in the art. As used herein, an electromagnet of a magnetic structure associated with a sample well (electromagnet A) is vertically adjacent to an electromagnet of a movable electromagnetic assembly (electromagnet B), which is inserted into the sample well, when that the lateral separation of the electromagnet A relative to electromagnet B is less than a respective lateral separation of the electromagnet A relative to the other electromagnets of the magnetic structure. In other words, while in some cases two vertically adjacent electromagnets exhibit no lateral offset, in other cases two vertically adjacent electromagnets can exhibit a lateral offset. The term "a magnetic sample," as used herein, refers to a sample that contains magnetic particles, or is otherwise magnetic.

Figure 1:
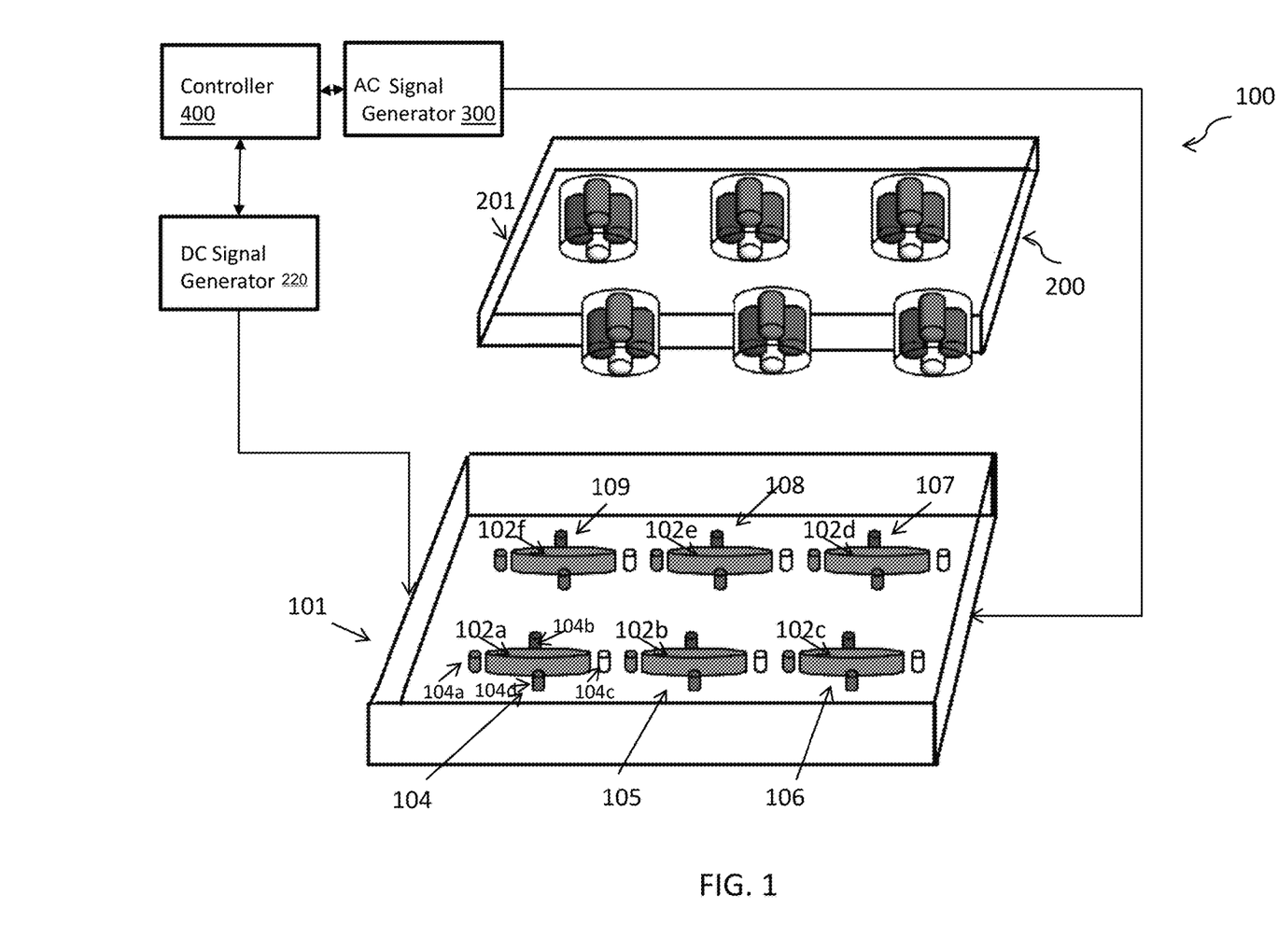
FIG. 1 schematically depicts a fluid processing system according to an embodiment of the present teachings, which includes a container providing a plurality of sample wells and a plurality of movable electromagnetic assemblies configured for insertion into the sample wells, FIG. 2 schematically depicts an example sample well and an example movable electromagnetic assembly configured for insertion into the sample well, FIG. 3 schematically illustrates examples of phase delays that can correspond to signals applied to electromagnets disclosed herein.

With reference to FIG. 1, a fluid processing system 100 according to an embodiment, which includes a sample container 101 providing a plurality of sample wells 102a-102f and a plurality of magnetic structures 104, 105, 106, 107, 108, 109 that are associated with the sample wells. In this embodiment, the magnetic structures 104, 105, 106, 107, 108, 109 include a plurality of electromagnets 104(*a, b, c, d*) that are distributed around the sample wells such that four electromagnets are disposed around each sample well. As discussed in more detail below, the application of AC signals with different phases to these electromagnets can generate magnetic fields in the sample wells, which can cause mixing of magnetic samples contained in those wells, as discussed in more detail below. More specifically, in this embodiment, the electromagnets a, b, c and d that make up each of magnetic structures 104, 105, 106, 107, 108, 109 are distributed such that four electromagnets surround the periphery of each sample well. In other embodiments, the number of electromagnets surrounding the sample well can be different, e.g., three, six, or eight electromagnets can be used. By way of example, with a focus on sample well 102a, the four electromagnets 104a-d surround the periphery of the sample well 102a and can be effective to cause mixing a magnetic sample contained in the sample well in the x-y planar section (i.e., a volume section generally orthogonal to a longitudinal axis of the sample well) via generation of magnetic fields within the sample well. Although in this exemplary embodiment, only six sample wells are depicted for illustrative purposes, it should be understood that the present teachings can be implemented using any desired number of sample wells.

The fluid processing system 100 further includes a plurality of movable electromagnetic assemblies 200 that can be placed at least partially within the sample wells to cause three-dimensional (3D) mixing of magnetic samples contained in the sample wells, as discussed in more detail below. In this embodiment, the magnetic assemblies 200 are coupled to a back plate 201 (shown in FIG. 1), which facilitates their insertion into and out the sample wells 102a-102f.

Figure 2:
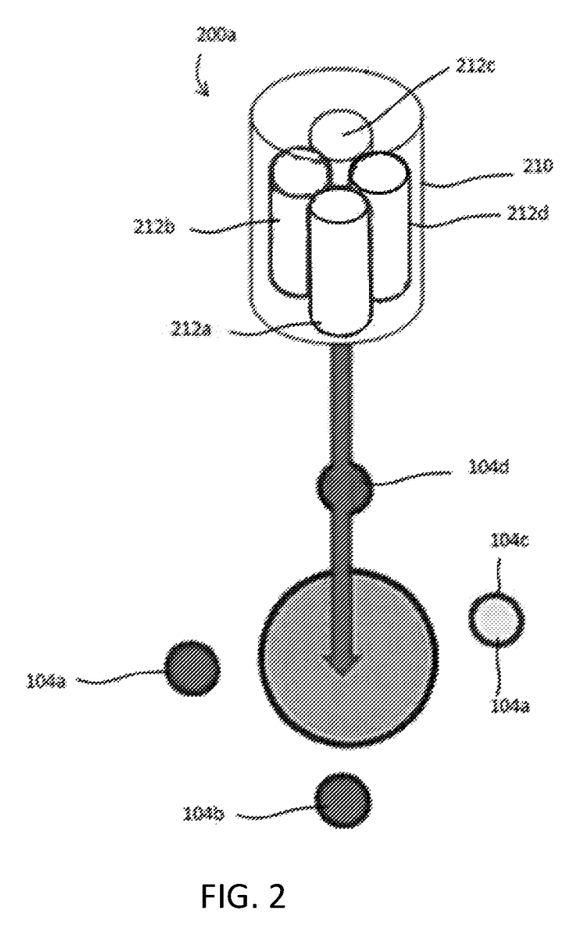

With reference to FIG. 2 and with a focus on one of the movable electromagnetic assemblies 200a, such an assembly can include a shell 210 in which four electromagnets 212a-212d are incorporated. The electromagnets 212a-212d can be activated in a manner discussed below to generate magnetic fields within a sample well into which it is inserted for mixing a magnetic sample therein.

In some embodiments, the shell can be formed of a material that exhibits a low absorption of the magnetic fields generated by the electromagnets 212a-212d. By way of example, in some embodiments, the shell can be formed of a polymeric material, such as polypropylene and polyethylene.

With continued reference to FIG. 2, the electromagnetic assembly 200a is sized and shaped for at least partial insertion into a respective sample well 102a. As discussed above, in this embodiment, the sample well 102a is surrounded by four electromagnets 104a-104d.

Referring back to FIG. 1, as discussed in more detail below, an AC signal generator 300 operating under the control of a controller 400 can apply AC signals with different phases to the electromagnets 104a-104d and 212a-212d so as to cause mixing of a magnetic sample contained in the sample wells 102a-102f.

Referring back to FIG. 2, the various electromagnets are labeled a-d according to the phase delay corresponding to the signal applied to the particular electromagnet. For example, the AC signals applied to the electromagnets 104a and 212a can exhibit the same phase, but a phase delay can exist between the adjacent electromagnets in the movable electromagnetic assembly 200a and the electromagnets 104a-104d surrounding the sample well. In some embodiments, the electromagnets 212a-212d can be angularly shifted relative to the electromagnets 104a-104d, e.g., by about 45 degrees.

Figure 3:
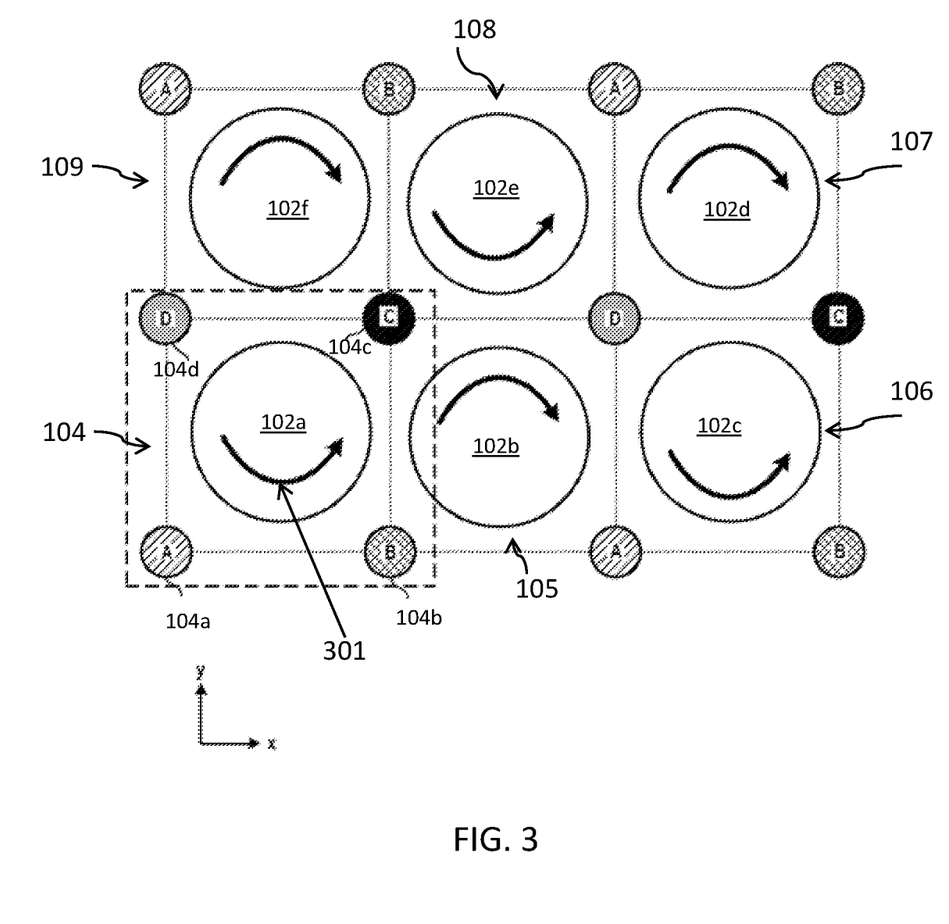

FIG. 3 schematically illustrates examples of phase delays that can correspond to signals applied to electromagnets disclosed herein. In the embodiment shown in FIG. 3, the phase delay between adjacent electromagnets of the movable electromagnetic assembly 200a and those surrounding the sample well is ±90°. By way of example, the RF currents applied to the electromagnets labeled a-d can be according to the following relations:

$$I_a = I_0 \sin(ft) \qquad \text{Eq. (1)}$$

$$I_b = I_0 \sin\left(ft + \frac{\pi}{2}\right) \qquad \text{Eq. (2)}$$

$$I_c = I_0 \sin(ft + \pi) \qquad \text{Eq. (3)}$$

$$I_d = I_0 \sin\left(ft + \frac{3\pi}{2}\right) \qquad \text{Eq. (4)}$$

The AC signal generator 300 (shown in FIG. 1) can apply similar AC signals to the electromagnets of the other movable electromagnetic assemblies associated with the other sample wells as well as the electromagnets surrounding those wells. Although in this embodiment, the phase shift between adjacent electromagnets is ±90°, it will nonetheless be appreciated that the present teachings are not so limited, as other phase shift values may be used according to various aspects of the present teachings, such as a 30° phase delay, a 60° phase delay, a 90° phase delay, a 120° phase delay, a 150° phase delay, a 180° phase delay, a 210° phase delay, a 240° phase delay, a 270° phase delay, a 300° phase delay, a 330° phase delay, or the like.

In various aspects, the actuation of the electromagnets (e.g., electromagnets 104a-104d) according to the above exemplary phase delay equations causes the magnetic particles (not shown) in the sample well 102a that are influenced by the magnetic field gradients generated by these electromagnets to mix in a counterclockwise motion in the x-y plane associated with these electromagnets (in FIG. 3, this counterclockwise motion is generally shown using an arrow 301). Further, the actuation of the electromagnets 212a-212d (FIG. 2) according to the above exemplary phase delay equations causes the magnetic particles in the sample well to mix in the x-y plane associated with these electromagnets. Further, as discussed below, the phase shifts between the AC signals applied to the electromagnets 212a-212d of the movable electromagnetic assembly 200a and the electromagnets 104a-104d associated with the sample well 102a can generate magnetic field gradients in x-y plane and along the z-direction (i.e., the longitudinal axis of the sample well) to provide 3-D mixing of the particles. Other patterns of AC phase differences can also be applied to the electromagnets 104a-104d and 212a-212d to cause other patterns of mixing. Mixing fluids using magnetic particles agitated according to various aspects of the applicant's teachings causes the magnetic particles to be three-dimensionally dispersed homogeneously within each fluid container.

Figure 4:
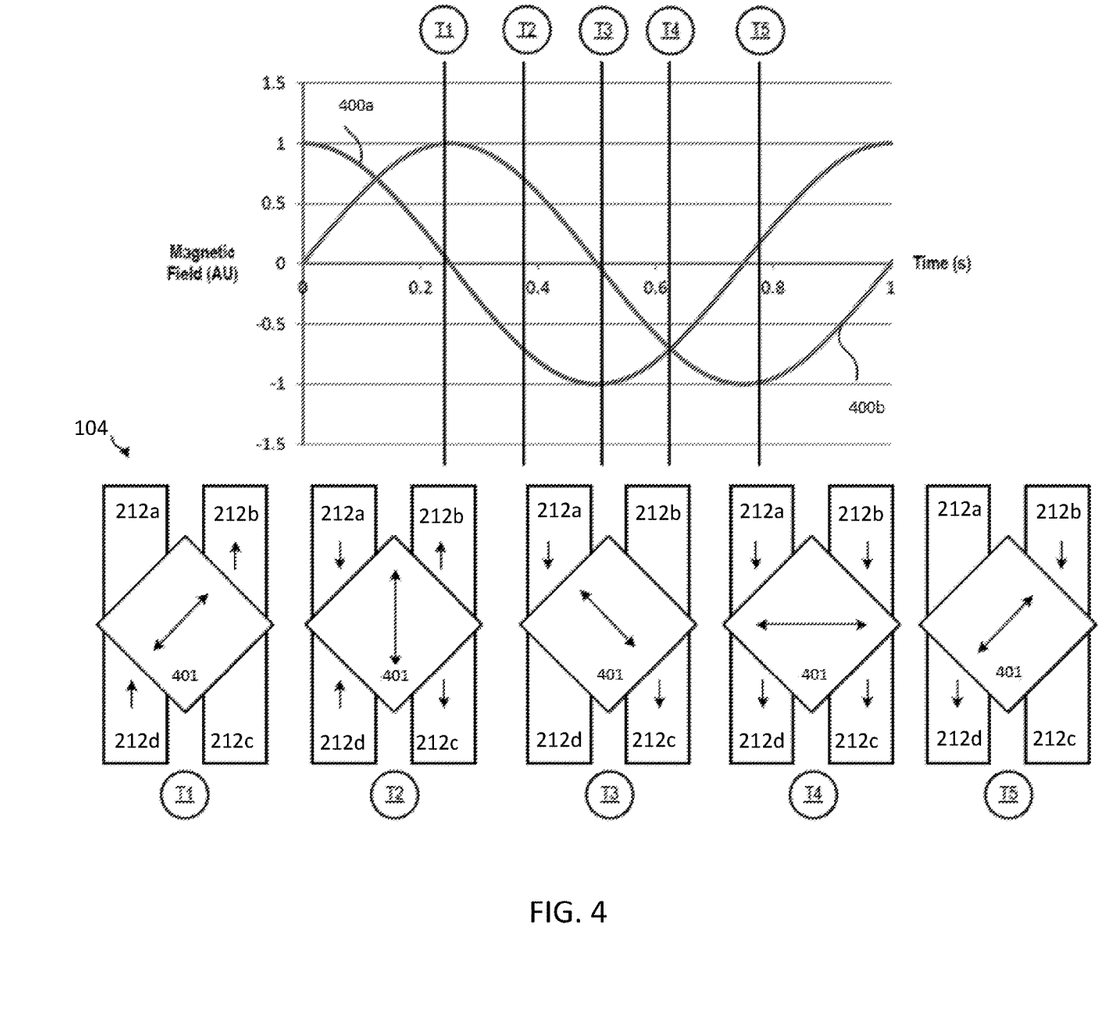
FIG. 4 depicts exemplary magnetic fields that can be generated by applying RF current signals to electromagnets described in some embodiments disclosed herein.

FIG. 4 depicts the exemplary magnetic fields at time intervals T1-T5, which can be generated by applying AC current signals to the electromagnets 104a-104d and/or 212a-212d in accordance with the above relations. Without any loss of generality, the exemplary magnetic fields are assumed to be those generated by the actuated electromagnets 212a-212d of the movable electromagnetic assembly 200a. In this exemplary embodiment, the waveforms of the magnetic fields 400a and 400b represent sine waves and generate the exemplary, schematic movement of magnetic particles 401 that are under the magnetic influence of the magnetic fields generated by the electromagnets 212a-212d. The magnetic fields 400a/400b have a 90° phase shift relative to one another, with the magnetic field 400a corresponding to electromagnets 212a and 212c and magnetic field 400b corresponding to electromagnets 212b and 212d. In the illustrative depiction of FIG. 4, it will be appreciated that the electromagnets 212a-212d are arranged at different locations relative to the fluid sample such that the orientation of the magnetic field generated by each electromagnet generally differs when the same electrical signal is applied thereto. Likewise, for the electromagnets arranged on opposed sides of the fluid sample, the magnetic field generated by such electrodes is in the same direction when AC signals of the same magnitude and of opposite phase are applied thereto.

It will thus be appreciated in light of the present teachings that different mixing patterns can be effectuated by controlling the AC waveforms applied to the electromagnets of 104a-104d and 212a-212d. By way of example, another fluid mixing pattern can be obtained by applying the following exemplary AC signals of different phase delays to the electromagnets 104a-104d and 212a-212d, where the substrate a, b, c, d denote the application of particular signal to the electromagnets 104a/212a, 104b/221b, 104c/212c, and 104d/212d, respectively:

$$I_A = I_0 \sin(ft) \qquad \text{Eq. (5),}$$

$$I_B = I_0 \sin(ft - \pi/2) \qquad \text{Eq. (6),}$$

$$I_C = I_0 \sin(ft - \pi) \qquad \text{Eq. (7),}$$

$$I_D = I_0 \sin(ft - 3\pi/2) \qquad \text{Eq. (8),}$$

wherein I=electrical current, f=frequency, and t=time.

The application of the RF signals denoted by above Eqs. (5)-(8) can cause a magnetic fluid in the sample well 102a to be mixed in a generally counterclockwise manner.

Although in the above embodiment, sinusoidal RF waveforms are applied to the electromagnets 104a-104d and 212a-212d, the present teachings are not so limited. Indeed, it will be appreciated that any type of waveform may be supplied to electromagnets capable of operating according to applicant's teachings. By way of non-limiting example, the number of electromagnets surrounding each fluid container, the phase shifts between adjacent electromagnets (e.g., a 30°, 60°, 90°, 120°, 150°, 180°, 210°, 240°, 270°, 300°, and 330° phase shifts), and the waveform shape can be varied in accordance with variance aspects of the present teachings. Non-limiting examples of electrical current waveforms may include square, rectangular, triangular, asymmetrical, sawtooth, or any combinations thereof. In some embodiments, the type of current supplied to the electromagnets may be modified during operation of a fluid processing system configured according to some embodiments. For instance, at least a portion of the electromagnets may receive an AC waveform with a 90° phase shift, while another portion may receive an AC waveform with a 180° phase shift. In such an embodiment, the phase shift of each portion may be modified during operation of the fluid processing system (e.g., the phase shifts may be switched, synchronized, or the like). In some embodiments, at least a portion of the electromagnets may be operated in parallel, sequence, pulsed, or the like. In various aspects, the current supplied to the electromagnets may be controlled according to a processing protocol. In some embodiments, the processing protocol may be dynamically altered during operation of the fluid processing system based on various factors, such as feedback, operator input, detection of mixing efficiency, analysis results, or the like.

Additionally or alternatively, a DC signal can be applied to the electromagnets 104a-104d and 212a-212d via a DC signal generator (such as the DC signal generator 220 schematically depicted in FIG. 1) so as to generate a static magnetic field in order to draw the magnetic particles to one side of the fluid container (and out of the bulk fluid) and to aid in fluid transfer from the container after the mixing step and/or prevent the aspiration of the magnetic particles, by way of non-limiting example.

With reference to FIGS. 1 and 3, the vertical separation of the electromagnets of each of the movable electromagnetic assemblies 200 and those of the magnetic structures 104, 105, 106, 107, 108, 109 associated with a respective sample well can cause the mixing of the magnetic particles within a sample fluid along the vertical direction, i.e., along the z-axis, as well as in the horizontal plane, i.e., in the x-y plane, thereby providing a three-dimensional mixing of the magnetic particles. Again with a focus on the movable electromagnetic assembly 200a and the respective sample well 102a depicted in FIG. 2, the electromagnets 212a, 212b, 212c, and 212d are vertically adjacent the electromagnets 104a, 104b, 104c, and 104d, respectively. As discussed above, the electromagnets are labeled a-d according to the phase of the AC signals applied thereto, e.g., in accordance with the above Equations (1)-(8). Again, as discussed above, the application of the AC signals with different phases to the electromagnets 104a-104d, e.g., a phase difference of 90 degrees between adjacent electromagnets, can generate magnetic fields that can cause mixing of the magnetic particles in a sample fluid in the x-y plane. Likewise, the application of RF signals with different phases to the electromagnets 212a-212d, e.g., a phase difference of 90 degrees between adjacent electromagnets, can result in magnetic fields that can cause mixing of the magnetic particles in the x-y plane. In addition, the pattern of the AC signals applied to the electromagnets 104a-104d and 212a-212d can be effective to generate magnetic field gradients in the vertical direction (i.e., z-direction), thereby additionally resulting in the vertical mixing of the magnetic particles. By way of example, the application of AC signals having a phase shift of ±90° to vertically adjacent electromagnets, e.g., electromagnets 104a and 212a, can generate magnetic field gradients along the z direction. In some embodiments, the pattern of AC signals applied to the electromagnets 104a-104d and 212a-212d can influence the magnetic particles within a sample fluid to rotate, spin, and/or move horizontally side-to-side, and/or vertically up-and-down within the fluid sample by the combined effects of the magnetic field gradients generated by the various electromagnets.

Agitating the magnetic particles according to various aspects of the present teachings causes the magnetic particles to be dispersed homogeneously horizontally and vertically within each fluid container, providing for optimal exposure and enhanced mixing of the fluid. Any number of mixing patterns can be provided by altering the phase and/or amplitude of the AC signals applied to the electromagnets 104a-104d and 212a-212d. By way of example, the pattern of the AC signals applied to the electromagnets 104a-104d of the movable electromagnetic assembly 200a can be selected such that the magnetic fields generated thereby can cause a clockwise mixing of the magnetic particles while the pattern of the AC signals applied to the electromagnets 212a-212b can cause a counter-clockwise mixing of the magnetic particles while the phase shifts between the AC signals applied to the electromagnets of 104a-104d and 212a-212d can cause a vertical mixing of the magnetic particles, e.g., in a manner discussed above.

With reference to FIG. 1, after the mixing process is accomplished, the application of the RF signals to the electromagnets of the magnetic field assemblies, e.g., electromagnets 212a-212d, and those associated with the magnetic structures of the sample well, e.g, electromagnets 104a-104d, can be terminated and one or more DC voltages, e.g., in a range of about 1 volt to about 100 volts, can be applied, e.g., by a DC voltage source (not shown), to one or more of the electromagnets of one or more of the magnetic assemblies to trap the magnetic particles on the surfaces of the assemblies. By way of example, the application of DC voltages to the electrodes 212a-212d of the movable electromagnetic assemblies 200a can cause the trapping of the magnetic particles on the surface of the shell 210. The movable electromagnetic assemblies 200a can then be used to deliver the trapped particles to a another device, e.g., a sample processing/washing vial or a sampling device, such as an open port (OPP) sampling device.

Figure 5:
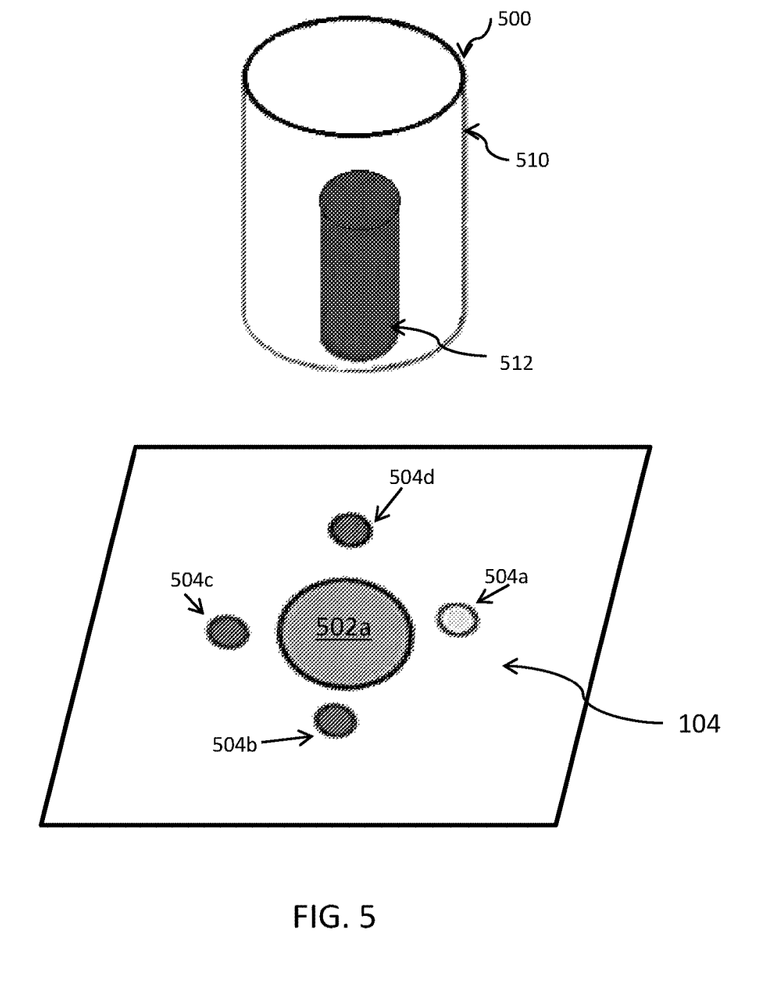
FIG. 5 illustrates an example of a sample well 102 and an example of an electromagnetic assembly according to some embodiments disclosed herein.

With reference to FIG. 5, in some embodiments of the present teachings, a movable electromagnetic assembly 500 can have a single electromagnet 512 disposed in a shell 510, e.g., to eliminate cross-over contaminations. In such an embodiment, the application of a an AC signal to the electromagnet 512 with a phase that is different from the phase of any of the signals applied to the electromagnets 504a-504d of a respective sample well 502a can cause 3-D magnetic mixing. By way of example, the signals applied to the electromagnets 504a-504d associated with the sample well 502a can be according to the above Equations (1)-(4) while the signal applied to the electromagnet 512 of the movable assembly 500 can be according to the following relation:

$$I_{MEMA} = I_0 \sin(ft + 0.75\pi) \qquad \text{Eq. (9)}$$

where $I_{MEMA}$ denotes a time-varying current in the electromagnet 512, $I_0$ denotes the current amplitude, and f is the signal frequency.

Similar to the previous embodiment, a DC magnetic field can be used for particle trapping and delivery. The single movable electromagnetic assembly has a simple design and in some embodiments it can be formed with a smaller size than a movable electromagnetic assemblies having more electromagnets.

In some embodiments, the signals applied to the electromagnets of the movable magnetic assemblies and/or those of the magnetic structures associated with the sample wells can have a frequency in a range of about less than 1 Hz (e.g., 0.5 Hz) to about 5000 Hz.

Figure 6:
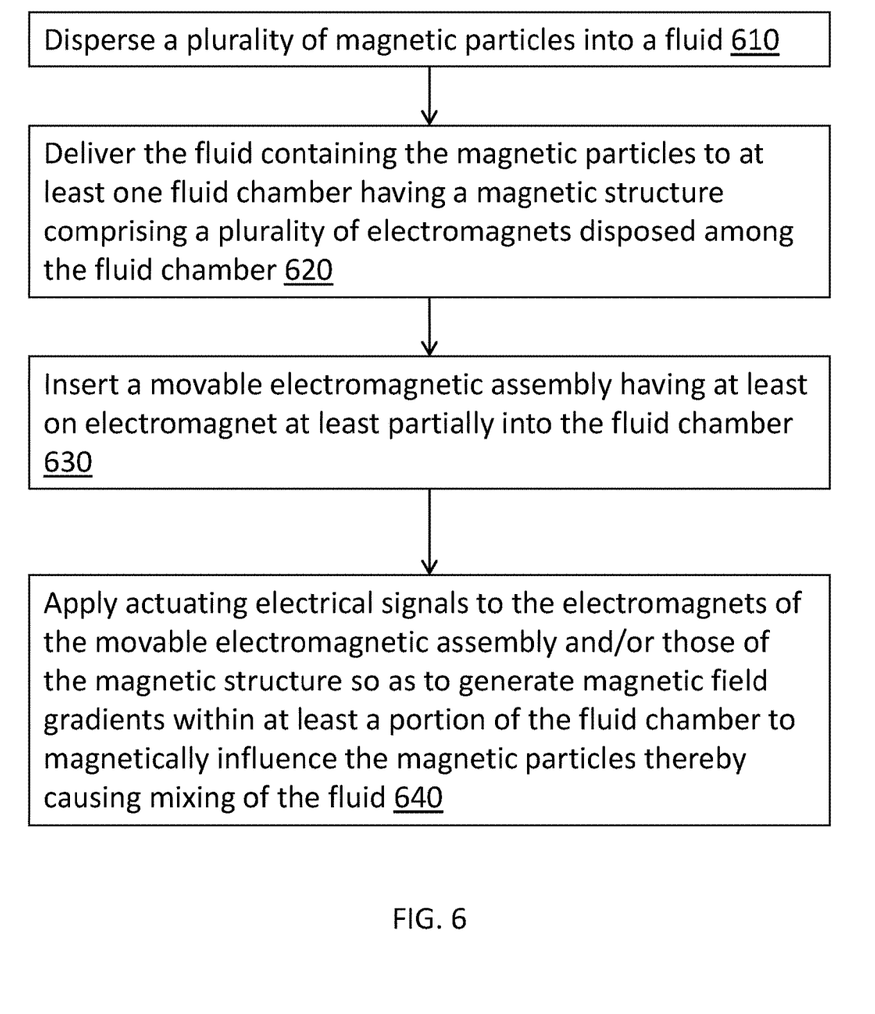
FIG. 6 is a flow diagram of procedures for mixing a fluid according to some embodiments disclosed herein.

With reference to FIG. 6, in a method according to an embodiment of the present teachings for mixing a fluid, a plurality of magnetic particles are dispersed within the fluid 610, and the fluid containing the magnetic particles is delivered to at least one fluid chamber having a magnetic structure comprising a plurality of electromagnets that are disposed around the fluid chamber 620. A movable electromagnetic assembly having at least one electromagnet is inserted at least partially into the fluid chamber 630. Electrical actuation signals, e.g., AC signals such as those discussed above, are applied to the electromagnets of the magnetic structure associated with the fluid chamber and/or those of the movable electromagnetic assembly so as to generate magnetic field gradients within at least a portion of the fluid chamber effective to magnetically influence the magnetic particles, thereby causing the mixing of the fluid 640. The pattern of the electrical signals applied to the electromagnets of the movable electromagnetic assemblies and those of the sample wells can be adjusted, e.g., in a manner discussed above, so as to generate a variety of different mixing patterns, both in the horizontal volumetric portions of the sample well as well as along a vertical direction of the sample well.

Figure 7:
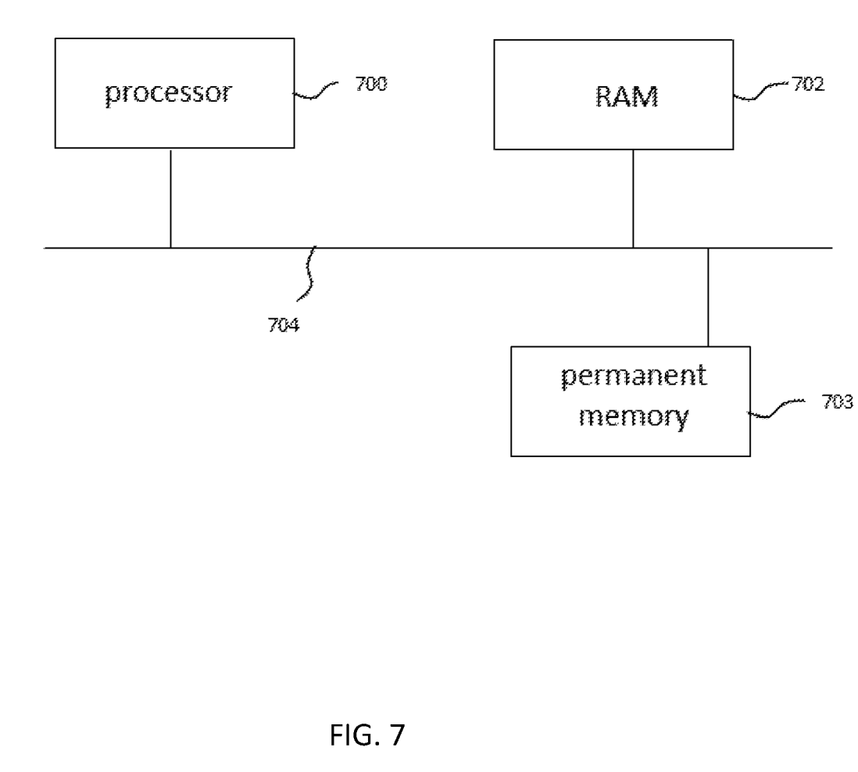
FIG. 7 is a block diagram of an exemplary controller that can be used with embodiments disclosed herein, FIGS. 8A-8C schematically depict the use of a movable electromagnetic assembly according to the present teachings for moving a sample from one sample vial to another.

The controller 400 can be implemented in hardware, software and/or firmware. For example, with reference to FIG. 7, the controller 400 can include a processor 700, at least one random access memory (RAM) module 702, at least one permanent memory module 703 and one or more communications buses 704 that allow these components to communicate with one another. A protocol for mixing the magnetic particles can be stored, e.g., in the permanent memory module 703 and can be loaded into RAM 702 during runtime, via the processor 700, for selective activation of the electromagnets of the movable electromagnetic assemblies and the magnetic structures associated with the sample wells.

Figure 8A:
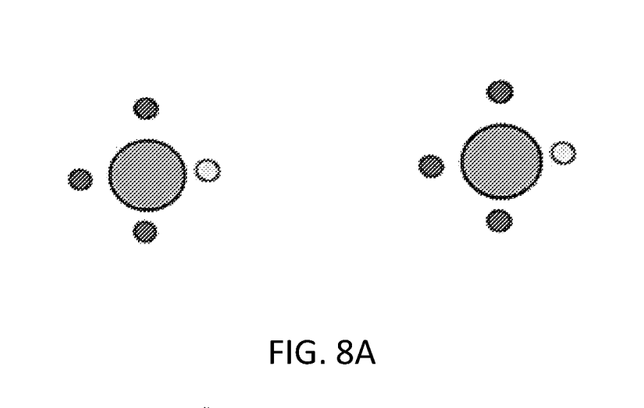
Figure 8B:
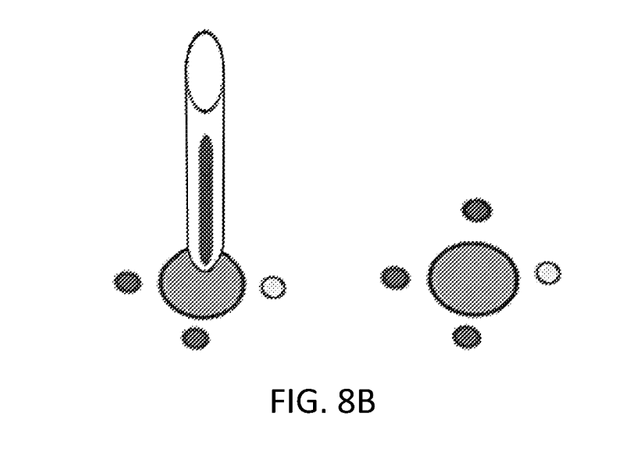
Figure 8C:
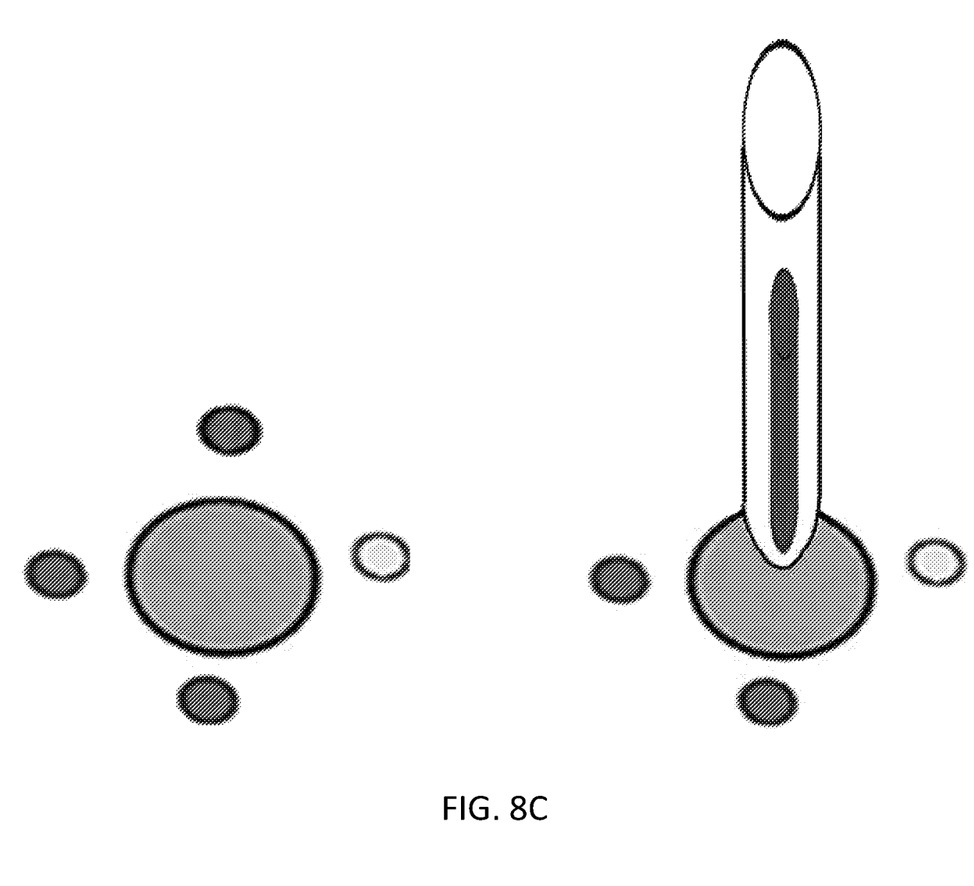

As noted above, in some embodiments, a movable electromagnetic assembly according to the present teachings can be employed to transfer magnetic particles, e.g., magnetic beads from one sample chamber, e.g., a sample vial, to another. By way of further illustration and with reference to FIGS. 8A to 8C, in one embodiment, the AC signals applied to the electromagnets of a sample vial A, into which the movable electromagnetic assembly was inserted can be turned off and a DC signal can be applied to at least one of the electromagnets of the movable electromagnetic assembly to collect at least a portion of magnetic particles within the sample vial A onto the surface of the movable electromagnetic assembly (FIG. 8A). The movable electromagnetic assembly can then be removed from the sample vial A and transferred to another sample vial B (FIG. 8B). The DC signal applied to the movable electromagnetic assembly can be turned off to allow the particles collected on the movable electromagnetic assembly to enter the sample vial B. In some embodiments in which sample vial B includes a magnetic structure comprising a plurality of electromagnets such as those discussed above that surround sample vial B, one or more signals, such as the AC signals discussed above, can be applied to one or more of the electromagnets surrounding sample vial B to facilitate the release of the magnetic particles from the movable electromagnetic assembly into vial B, e.g., into a solution in vial B. Those having ordinary skill in the art will appreciate that various modifications can be made to the above embodiments without departing from the scope of the invention.

What is claimed is:

1. A fluid processing system, comprising,
a sample container including at least one sample chamber for containing a fluid and a plurality of magnetic particles,
at least one movable magnetic assembly configured to be movably inserted into or out of said sample chamber, said movable magnetic assembly comprising a plurality of electromagnets arranged to generate a magnetic field within at least a portion of the sample chamber when the assembly is inserted at least partially into said sample chamber,
at least one magnetic structure comprising a plurality of electromagnets disposed around said sample chamber,
at least one signal generator for applying electrical signals to said electromagnets of the magnetic assembly and said plurality of electromagnets of said movable magnetic assembly, where said signal generator is configured to generate AC signals for application to said plurality of electromagnets of said magnetic assembly and said plurality of electromagnets of said at least one magnetic structure, and
a controller coupled to said signal generator for controlling phases of the electrical signals applied to said electromagnets so as to generate magnetic field gradients within said at least a portion of the sample chamber effective to magnetically influence the plurality of the magnetic particles.

2. The fluid processing system of claim 1, wherein said AC signals have a frequency in a range of 0.1 Hz to 5000 Hz.

3. The fluid processing system of claim 2, wherein said AC signals are voltage signals with an amplitude in a range of 1 volt to 100 volts.

4. The fluid processing system of claim 1, wherein said electromagnets of said magnetic assembly are arranged so as to cause mixing of the magnetic particles substantially within a plane.

5. The fluid processing system of claim 1, wherein said plurality of electromagnets of said magnetic assembly comprises a first, a second, a third and a fourth electromagnet and wherein said controller is configured to affect the application of a plurality of electrical signals to said electromagnets in accordance with the following relations:

$$I_{first} = I_0 \sin(ft)$$
$$I_{second} = I_0 \sin\left(ft + \frac{\pi}{2}\right)$$
$$I_{third} = I_0 \sin(ft + \pi)$$
$$I_{fourth} = I_0 \sin\left(ft + \frac{3\pi}{2}\right)$$

wherein $I_{first}$, $I_{second}$, $I_{third}$, and $I_{fourth}$ represent, respectively, waveforms applied to the first, second, third and fourth electromagnets, $I_0$ represent signal amplitude and f denotes signal frequency.

6. The fluid processing system of claim 1, wherein said movable magnetic assembly comprises a shell in which said plurality of electromagnets are incorporated, said shell being shaped and sized for at least partial insertion in said sample chamber.

7. The fluid processing system of claim 1, wherein said controller is configured to cause application of electrical signals having different phases to said electromagnets of the at least one magnetic structure so as to generate magnetic field gradients within at least a portion of said sample chamber effective to magnetically influence the magnetic particles.

8. The fluid processing system of claim 7, wherein said electromagnets of said at least one magnetic structure are vertically spaced from the electromagnets of said movable magnetic assembly and said controller affects application of a pattern of electrical signals to said electromagnets of the magnetic structure and the electromagnets of said movable magnetic assembly so as to generate magnetic field gradients along said vertical direction.

9. The fluid processing system of claim 8, wherein said plurality of electromagnets of the movable magnetic assembly comprises a first, a second, a third and a fourth electromagnet and said electromagnets of said at least one magnetic structure comprises a first, a second, a third and a fourth electromagnet and wherein said controller is configured to affect the application of a plurality of electrical signals to said electromagnets in accordance with the following relations:

$$I_{first,MEMA} = I_0 \sin(ft)$$

$$I_{second,MEMA} = I_0 \sin\left(ft + \frac{\pi}{2}\right)$$

$$I_{third,MEMA} = I_0 \sin(ft + \pi)$$

$$I_{fourth,MEMA} = I_0 \sin\left(ft + \frac{3\pi}{2}\right)$$

$$I_{first,MS} = I_0 \sin\left(ft + \frac{\pi}{2}\right)$$

$$I_{second,MS} = I_0 \sin(ft + \pi)$$

$$I_{third,MS} = I_0 \sin\left(ft + \frac{3\pi}{2}\right)$$

$$I_{fourth,MS} = I_0 \sin(ft)$$

wherein $I_{first,MEMA}$, $I_{second,MEMA}$, $I_{third,MEMA}$, and $I_{fourth,MEMA}$ represent, respectively, waveforms applied to the first, second, third and fourth electromagnets of the magnetic field assembly, $I_{first,MS}$, $I_{second,MS}$, $I_{third,MS}$, and $I_{fourth,MS}$ represent, respectively, to signal waveforms applied to the first, second, third and fourth electromagnets of the at least one magnetic structure surrounding the sample chamber, $I_0$ represents signals amplitude and f denotes signal frequency, wherein, $I_{first,MEMA}$ and $I_{first,MS}$ are vertically adjacent,
$I_{second,MEMA}$ and $I_{second,MS}$ are vertically adjacent,
$I_{third,MEMA}$ and $I_{third,MS}$ are vertically adjacent,
$I_{fourth,MEMA}$ and $I_{fourth,MS}$ are vertically adjacent.

10. The fluid processing system of claim 1, wherein said controller comprises at least one memory module configured to store at least one sample processing protocol for execution by the controller.

11. The fluid processing system of claim 1, further comprising a DC signal generator operating under control of the controller for applying one or more DC signals to one or more of said electromagnets of said magnetic assembly for trapping said magnetic particles.

12. The fluid processing system of claim 1, wherein said at least one sample chamber comprises a plurality of fluidically-isolated sample chambers.

13. The fluid processing system of claim 12, wherein said at least one magnetic structure comprises a plurality of magnetic structures associated with said plurality of sample chambers, and wherein at least at least two of said magnetic structures have at least one electromagnet in common.

14. The fluid processing system of claim 1, wherein said at least one sample chamber has a volume in a range of 1 microliter to 1 liter.

15. A fluid processing system, comprising,
a sample container including at least one sample chamber for containing a fluid and a plurality of magnetic particles,
at least one movable magnetic assembly comprising one electromagnet and configured to be movably inserted into or out of said sample chamber,
a magnetic structure comprising a plurality of electromagnets disposed around said sample chamber,
at least one signal generator for applying electrical signals to said one electromagnet of said movable magnetic assembly and said electromagnets of the magnetic structure, where said at least one signal generator is configured to generate AC signals for application to said one electromagnet of said magnetic assembly and said electromagnets of the magnetic structure, and
a controller coupled to said signal generator for controlling phases of the electrical signals applied to said electromagnets of the magnetic structure and said one electromagnet of said movable magnetic assembly so as to generate magnetic field gradients within at least a portion of the sample chamber effective to magnetically influence the plurality of the magnetic particles.

16. The fluid processing system of claim 15, wherein said controller is configured to affect application of a signal to said electromagnet of the movable magnetic assembly having a phase different than phases of the signals applied to said electromagnets of the magnetic structure.

17. A method for processing fluids, comprising
delivering a fluid sample and a plurality of magnetic particles to a fluid chamber having a magnetic structure comprising a plurality of electromagnets disposed around said fluid chamber,
inserting a movable electromagnetic assembly at least partially into said fluid chamber, said movable electromagnetic assembly comprising at least one electromagnet,
applying AC electrical signals of varying phases to said electromagnets of said magnetic structure and said at least one electromagnet of the movable electromagnetic assembly so as to generate magnetic field within at least a portion of said fluid chamber effective to magnetically influence the magnetic particles, thereby causing mixing of the fluid.

18. The method of claim 17, further comprising:
subsequent to mixing of said fluid, terminating application of the AC electrical signals to said electromagnets, and
applying at least one DC signal to said at least one electromagnet of the movable electromagnetic assembly for trapping at least a portion of said magnetic particles in said movable electromagnetic assembly.

* * * * *